United States Patent [19]

Held

[11] Patent Number: 4,804,428
[45] Date of Patent: Feb. 14, 1989

[54] METHOD AND DEVICE FOR THE DIVISION OF METAL COATED LAMINATE WEBS INTO INDIVIDUAL PANELS

[76] Inventor: Kurt Held, Alte Strasse 1, D-7218 Trossingen-Schura, Fed. Rep. of Germany

[21] Appl. No.: 92,232

[22] Filed: Sep. 2, 1987

[30] Foreign Application Priority Data

Sep. 5, 1986 [DE] Fed. Rep. of Germany ....... 3630269

[51] Int. Cl.⁴ .............................................. B26D 1/22
[52] U.S. Cl. ...................................... 156/267; 85/455; 85/508; 156/269; 156/324; 156/353; 156/555
[58] Field of Search ................. 156/267, 64, 269, 353, 156/583.5, 555; 83/71, 100, 302, 455, 456, 481, 319, 508, 923 CC

[56] References Cited

U.S. PATENT DOCUMENTS

| | | | |
|---|---|---|---|
| 2,538,972 | 1/1951 | Magnani | 83/302 |
| 3,165,017 | 1/1965 | Galabert | 83/319 |
| 3,757,618 | 9/1973 | Kuts | 83/508 |
| 3,763,748 | 10/1973 | Gallagher | 83/508 |
| 3,798,767 | 3/1974 | Rizer et al. | 83/508 |
| 4,009,628 | 3/1977 | Kato | 83/100 |
| 4,401,001 | 8/1983 | Gerber et al. | 83/508 |
| 4,414,874 | 11/1983 | Barnes et al. | 83/508 |
| 4,534,002 | 8/1985 | Urban | 83/71 |
| 4,561,335 | 12/1985 | Wingen | 83/481 |
| 4,579,612 | 4/1986 | Held | 156/64 |

Primary Examiner—David Simmons
Attorney, Agent, or Firm—Toren, McGeady & Associates

[57] ABSTRACT

A process and device for subdivision of a continuously fabricated metal backed laminate web into individual panels of any size, uses a computer and a numerically controlled saw. A contour path is controlled by the computer. A saw blade of the saw located in the saw head has a side support at the severance edges to be cut. This side support contains small cutter plates which are applied with one of their side faces against the saw blade with slight pressure. Each support has an additional narrow edge surface which is held against the metal backed laminate web. For trimming pressed edges of the web that are cured without pressure, fixed circular saws with their own side supports are arranged at the edge of the metal backed laminate web, upstream of the saw head.

19 Claims, 6 Drawing Sheets

METHOD AND DEVICE FOR THE DIVISION OF METAL COATED LAMINATE WEBS INTO INDIVIDUAL PANELS

FIELD AND BACKGROUND OF THE INVENTION

The present invention is directed to a method and device for the subdivision of a continuously fabricated, endless metal coated or backed laminate web into individual panels.

Metal coated laminates consist of a laminate plastics core, wherein on at least one surface of this laminate plastics core, a metal foil is placed and firmly connected. The laminate plastics core again, as a rule, is composed of individual layers of carrier or support material impregnated with duroplastic resin. Such a metal coated laminate is, for instance, a copper coated electrolaminate which serves as the initial material for fabrication of printed circuit boards. This consists of individual layers of fiberglass tissue or fabric impregnated with epoxy resin which are extruded or pressure molded under the action of heat and pressure, with galvanically precipitated copper foil of high purity deposited thereon.

Increasingly continuous processes are used for the fabrication of such metal coated laminates since these yield an enhanced quality and quantity when compared with the discontinuous processes. Such a continuous process which operates with a double band press is indicated in German Laid-Open Patent Application OS No. 33 07 057. Since the metal coated laminate is obtained as an endless web in the continuous processes, it is, however, necessary to subsequently subdivide this web into individual panels.

It is known from the above-mentioned publication to use hammer shears behind the double band press. With such shears, one obtains panels which have the width of the laminate webs and a length corresponding to certain preset fixed dimensions. With this method, however, one does not obtain a clean sectioned edge. In the section edge produced with the shears, the metal foil lifts off the laminate plastics core in the edge region. Upon touching this edge, glass fibers penetrate into the skin and the hardening agent used for accelerating the setting reaction of the resin which clings to the glass fibers results in itching, allergies, etc. It is therefore necessary to remove the burrs at the sectioned or severed edge by subsequently machining these sectional edges with a milling machine. This subsequent machining results in additional costs.

It is furthermore known to utilize circular saws used in timber processing installations for cutting discontinuously fabricated or batch processed metal coated laminates. This, however, also does not yield a clean edge. This edge also has to be machined. In order to remedy this situation, several equally large panels of the metal coated laminates are stacked above each other, clamped together and then sawed into smaller panels, wherein, in that case, the sectioned edge is somewhat better. To be sure, this process again involves cost-intensive manual labor and cannot be automated. In addition, such a process can only be sensibly utilized in discontinuous or batch fabrication of the metal coated laminates since the laminates which have to be clamped in superimposed fashion must already be available as panels with specific fixed dimensions. Thus, it can be seen that this process cannot be utilized in the continuous fabrication of metal coated laminates.

In these known processes for subdividing metal coated laminates, it is thus a disadvantage that the panels are supplied with preset fixed dimensions and do not have the dimensions that are randomly desired by the buyer. In addition, these panels have sectioned edges which require additional machining. Thus, after the subdivision process, additional work processes and material oversizing must already by preplanned in the subdivision of the laminates.

SUMMARY OF THE INVENTION

The present invention is based upon the task of refining a process for subdividing a continuously fabricated metal coated laminate web in such a way that panels can be fabricated with dimensions randomly preset by the buyer within the width of the laminate web and whose section edges no longer have to be additionally machined.

Accordingly, an object of the present invention is to provide a process for subdividing a continuously advancing, endless metal lined laminate web into individual panels, the web having a laminated material core made of a plurality of duroplast resin impregnated web layers, and a metal foil layer on at least one surface of the core, comprising extruding the laminate web under pressure and heat to form a compact laminate web, feeding the compact laminate web continuously in a feed direction, storing the desired size of the panels in a computer, using the computer to control a saw having a saw blade to cut the laminate web into the panels at cut edges in the laminate web, and supporting the laminate web at sides of the saw blade and the cut edge as the saw blade cuts the laminate web.

A further object of the present invention is to provide a device for subdividing a laminate web into panels which comprises take-off units for supplying the resin impregnated web layers and the metal foil layer to a double band press for applying pressure and heat to the laminate web to extrude the laminate web and form a compact laminate web, a transverse cutting unit arranged downstream of the double band press in the feed direction of the compacted laminate web for subdividing the laminate web into the panels, the transverse cutting unit comprising a numerically controlled saw having a saw blade for cutting the laminate web in a direction transverse to the feed direction, a computer for controlling the saw, the numerically controlled saw comprising a saw head, a trolley for movement in the feed direction, a carriage mounted on the trolley for movement transverse to the feed direction and for carrying the saw head, the saw head having a saw blade for cutting the laminate and side supports having edges engageable with the laminate web on opposite sides of the blade and on opposite sides of a cutting edge in the laminate web which is cut by the saw blade.

The advantages attainable with the present invention consist especially in that the continuously fabricated metal coated laminate web can be subdivided into panels of random size. This largely avoids waste material. By means of a computer-aided optimization of the panel subdivision, the waste can be even further minimized. Because of the side support of the saw blade, clean section or severance edges are produced at the panel edges so that subsequent machining and associated costs are eliminated. With the invention, no oversizing for subsequent machining has to be calculated into the cutting process so that this again results in a better utilization of the material coated laminate web. Even if the metal coated laminate web is only to be subdivided into rectangular panels with the same width as the laminate web and a variable length, the method of the invention can also be used. The saw is then moved forward in the feed direction of the laminate web with the same velocity as the laminate web. For this purpose, the travelling trolleys for the web motion of the saw blade in the feed direction of the laminate web are rigidly coupled to the laminate web during the sawing process. Here also, one again obtains a clean severance edge which does not have to be subsequently machined and with a minimal use of material at the severance edge.

The method of the invention and the appertaining device can be used especially advantageously in connection with an installation for the fabrication of copper coated electrolaminates, an installation equipped with a double band press.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENT

Figure 1:
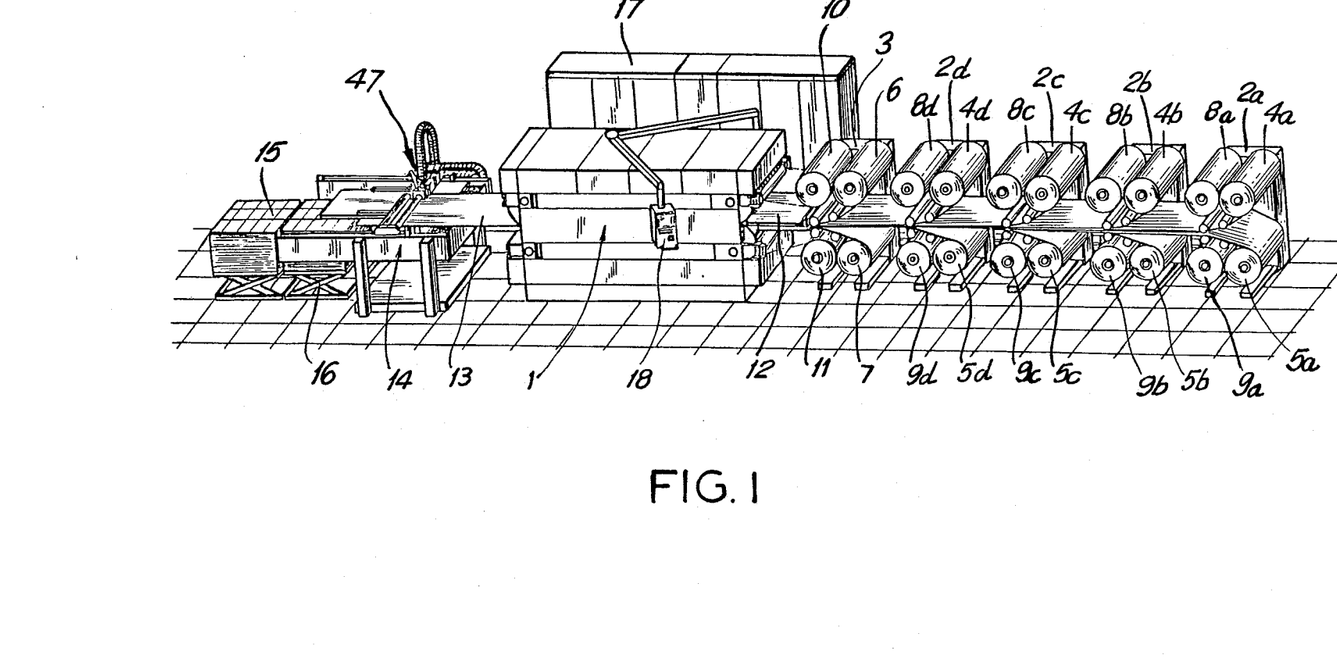
FIG. 1 is an overall perspective view of a device for the continuous fabrication of copper coated electrolaminates including the subdivision of the electrolaminate web into panels.

Referring to FIG. 1, the device for continuous fabrication of metal coated laminates comprises a double band press 1 with several aggregates arranged upstream and downstream of the press. In the present embodiment, the laminates are copper coated electrolaminates. Take-off units 2a to 2d and 3 with storage rollers 4a to 4d, 5a to 5d, 6 and 7 attached therein are arranged upstream of the double band press 1. The storage rollers 4a-4d and 5a-5d contain the fiberglass tissue that is impregnated with epoxy resin which is continuously taken up from these rollers and fed into the double band press 1 in accordance with the desired structure of the laminated plastics core. These fiberglass tissue webs constitute the laminated plastics core of the electrolaminate. An electrolytically precipitated copper foil is deposited, respectively, on the upper and lower surface of the laminated plastics core which is taken up or unreeled from the storage roller 6 or 7 in the take-off unit 3.

In the installation shown here, the laminated plastics core consists of a totality of eight fiberglass webs impregnated with resin. Depending on the required thickness of the electrolaminate or its desired stability, the laminated plastics web can also consist of more or fewer fiberglass webs. If desired, additional take-off units can therefore be arranged upstream of the double band press 1 or the take-off units which are not required, can be left without storage rollers. By leaving off one of the storage rollers 6 or 7, an electrolaminate copper coating on only one side can be fabricated. As can be additionally seen in FIG. 1, an auxiliary roller 8a-8d, 9a-9d, 10 and 11 can be provided in each take-off unit 2a-2d and 3 for each storage roller 4a-4d, 5a-5d, 6 and 7, from which auxiliary roller, the web is taken up as soon as the storage roller is empty. Thus, fabrication of the electrolaminate can be continued also in such a case without any interruption in production.

The webs 12 sandwiched in a layered manner behind the take-off unit 3 corresponding to the structure of the electrolaminate are then introduced into the double band press 1 and are there extruded continuously into an electrolaminate under the action of heat and area pressure. The double band press 1 can be subdivided into a heating and cooling zone so that the electrolaminate is already cooled in the double band press 1 under the action of pressure. Then the electrolaminate subsequently leaves the double band press 1 as a compact electrolaminate web 13 with uniform velocity and is further processed in following installation portions downstream of the double band press 1. If required, the electrolaminate web 13 can pass through an additional cooling apparatus for further cooling, which cooling apparatus is not shown in the drawing. Subsequently, the electrolaminate web 13 is subdivided into individual panels 15 in the lateral or transverse cutting station 14, which panels are stacked on pallets in a stacking device 16 for removal.

The entire process sequence in the installation shown in FIG. 1, meaning the take-off of the individual webs, the presetting and maintaining of the process parameters in the double band press and the subdivision of the electrolaminate web 13 into individuals panels, is controlled by a computer which is arranged in a control cabinet 17. The data terminal 18 is used for input of the parameters by the operator. Naturally, the computer in the control cabinet 17 can also be connected to an external host computer which is, for instance, located in the central electronic data processing unit in order to enable control of the production and backfeed of the production data for additional evaluation directly from the central unit.

The transverse cutting station 14 which divides the electrolaminate webs 13 into individual panels 15 is a contour controlled, numerically controlled saw with a saw head 47 that is displaceable along two axes at right angles to each other. These axes, along which the saw head 47 is displaceable, are arranged in such a manner that they extend in the x and y directions. The feed direction of the electrolaminate web 13 is designated as the x direction, and the perpendicular direction lying in the plane of the electrolaminate web 13 is designated as the y direction. If required, the saw head 47 additionally can be designed to be rotatable around a vertical axis which is perpendicular to the x and y directions. The saw head 47 of the transverse cutting station 14 is also controlled from the computer in the control cabinet 17. The operator of the installation puts in, by means of the data terminal 18 or a host calculator in the central electronic data processing unit which is coupled to the computer in the control cabinet 17, the sizes of the desired panels 15 and their shape, if this varies from a rectangle for the day's production or a production segment, since, in accordance with the process of the invention, a subdivision of the endless electrolaminate web 13 into random panel sizes and shapes is possible. The calculator now calculates a favorable subdivision on the basis of these preset values, so that the smallest possible waste results. Based on this calculation, the computer determines the sequence for the individual panels and calculates the control signals for the numerically controlled saw in accordance with the determined order or sequence, taking into account the feed velocity of the electrolaminate web 13 which is determined by the process parameters in the double band press 1 as well as the respective panel form and size. The control signals are then transmitted to the saw head 47 in the transverse cutting station 14 for actuation of its motors so that the desired panels are sawed from the continuously running electrolaminate web 13 and are deposited in the stacking unit 16 ready to be transported away. These panels are already shippable since their edges do not require any further machining. This is because of the side support of the section edge on the electrolaminate web 13 at the saw blade in accordance with the invention. The order of the subdivision into individual panels can be printed out expediently by the computer through a printer for documentation, which printer is, for instance, located in the central electronic data processing unit. Simultaneous issue of the packing sheet for the individual panels 15 is then also possible.

Figure 2:
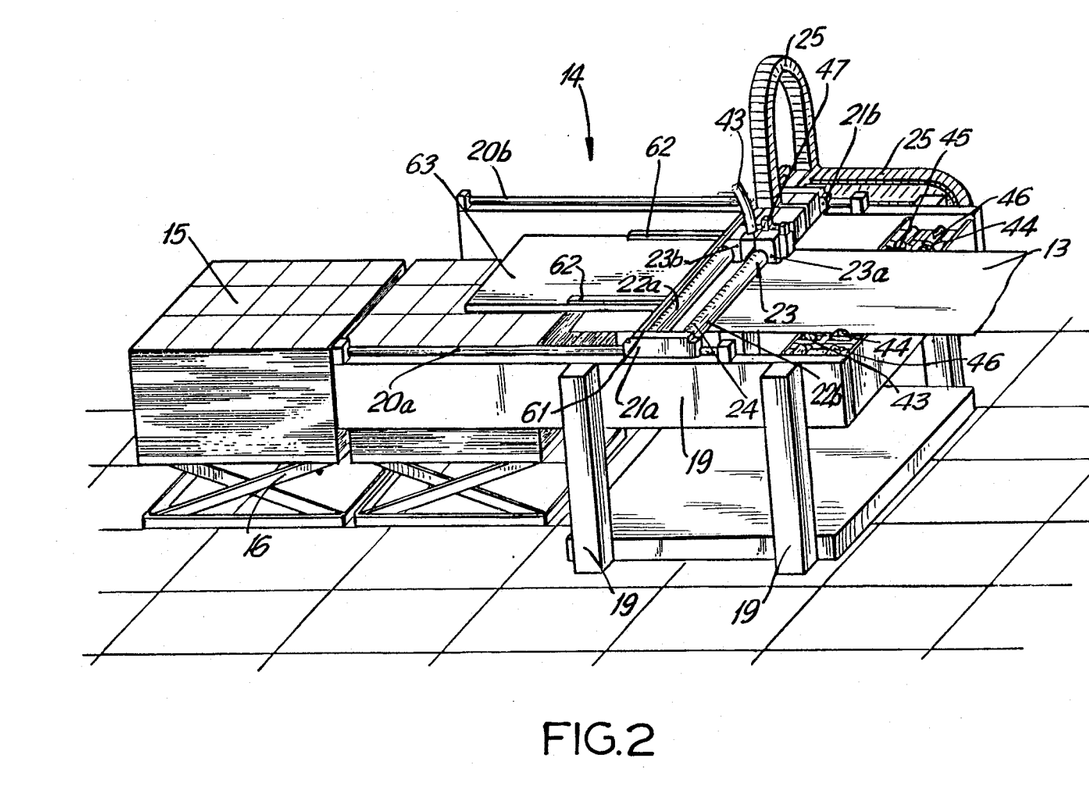
FIG. 2 is a perspective view of a numerically controlled saw for the subdivision of the electrolaminate web.

In FIG. 2, the transverse cutting station 14 designed as a numerically controlled saw is shown in an enlarged representation. It consists of a stand 19 in which there are located two guidance axes 20a, 20b in the x direction and aligned in parallel fashion. Respectively, one travelling trolley 21a, 21b is displaceably supported on each guidance axes 20a, 20b. These two trolleys 21a, 21b are connected with each other in the y direction by two guidance axes 22a, 22b aligned in parallel fashion. These guidance axes 22a, 22b are aligned in such a manner that they are at right angles to the feed direction of the electrolaminate web 13. A carriage 23 runs on the guidance axes 22a, 22b. Carriage 23 consists of two parts 23a, 23b, respectively supported by and displaceable on the corresponding guidance axes 22a, 22b. The saw head 47 proper is located between these two parts 23a, 23b and is fastened thereto. The carriage 23 as well as at least one of the trolleys 21a, 21b is motor driven and controlled by the computer in the control cabinet 17. Driving of the carriage is aided by a set of teeth 24 that are applied upon the guidance axes 22a, 22b, and into which engages a pinion, driven by a motor and fastened, in the carriage 23 or in the trolleys 21a, 21b. This pinion is not depicted in the drawing. The drive motors can be electric or hydraulic motors. The pinion and the drive motor for the carriage 23 are housed in a drive block 28 integrated into the two parts 23a, 23b of the carriage 23 (see FIGS. 3 and 4). The voltage supply or the supply of hydraulic liquid for the drive motor runs in flexible cable harnesses 25. By appropriate actuation of the trolleys 21a, 21b and the carriage 23, and allowing for the feed motion of the electrolaminate web 13, any desired two-dimensional contour curve can be followed by the saw head 47.

Figure 3:
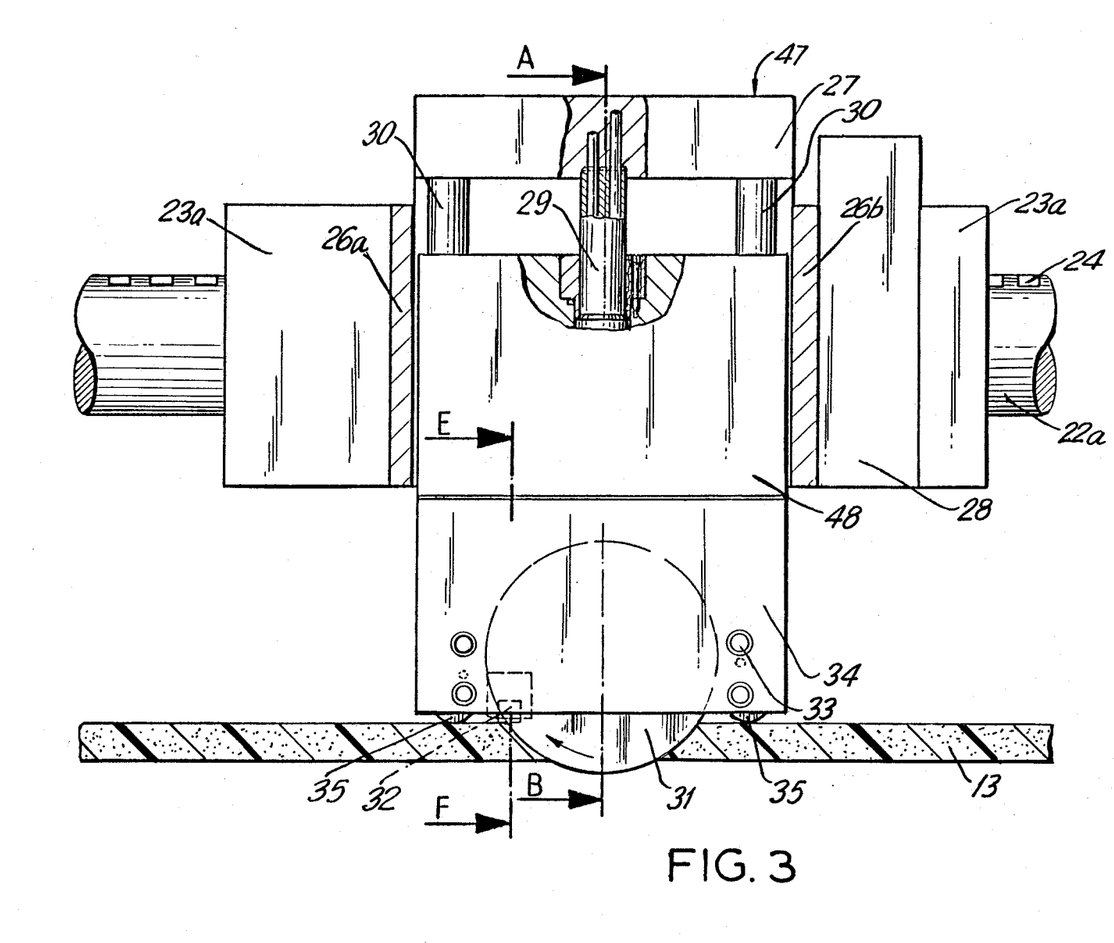
FIG. 3 is a view of the saw head at the carriage in the numerically controlled saw, taken along a vertical section between two guidance axes in a direction perpendicular to the feed direction of the laminate web.
Figure 4:
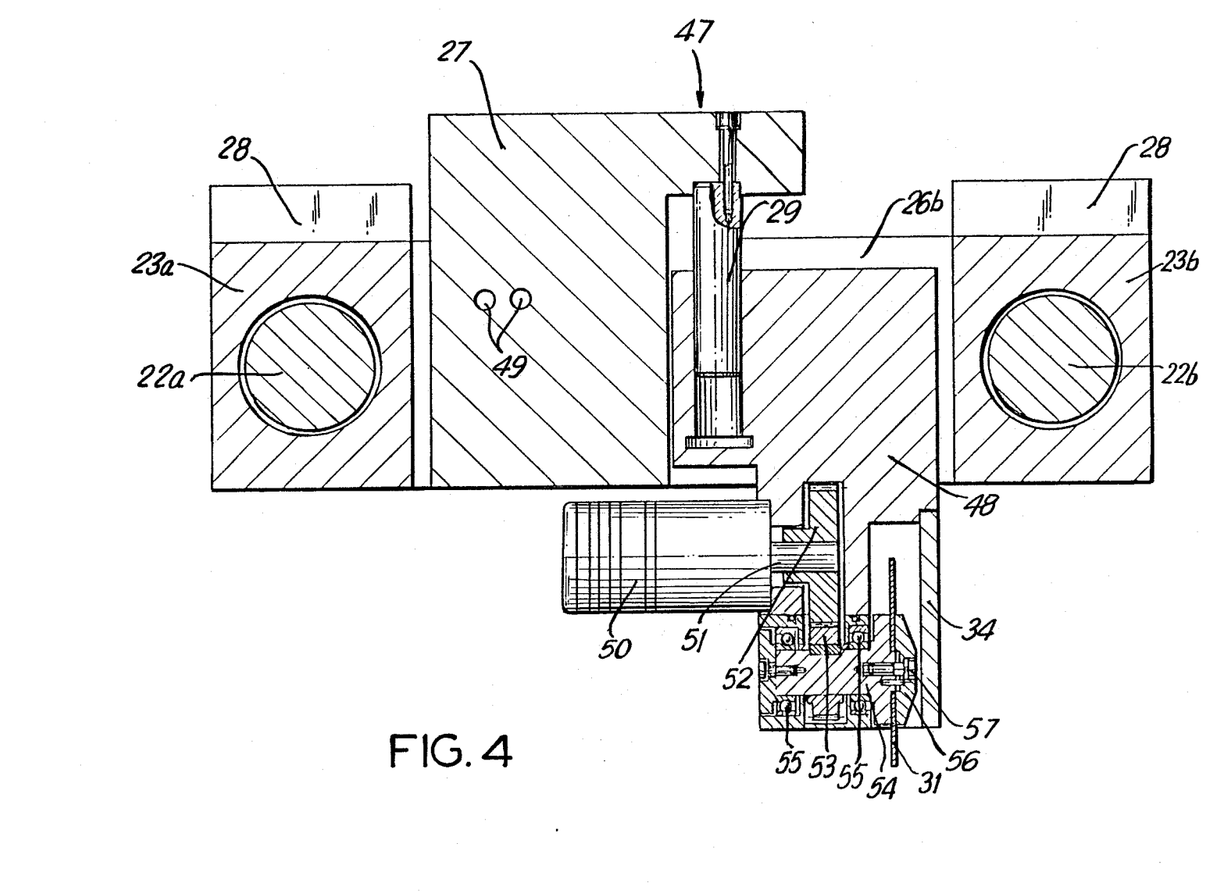
FIG. 4 is a sectional view taken through the saw head along the line A-B of FIG. 3.

The two parts 23a, 23b of carriage 23 carry the saw head 47 as can be seen in FIGS. 3 and 4. This saw head 47 consists of a retaining block 27 which is fastened at the carriage 23 by means of two retention brackets 26a, 26b attached at the sides. This attachment is indicated in FIG. 4 by threaded holes 49. The saw blade carrier 48 is supported in the retaining block 27 at two guide rods 30 to be displaceable in the vertical direction by a hydraulic cylinder 29. With this arrangement, the saw blade 31, which is located in the lower portion of the saw blade support 48, can be applied onto the laminate web 13 for the purpose of cutting it, or can be lifted off from the electrolaminate web 13 after the sawing process while being returned backwards into its initial position. A linear electromotor can be provided for vertical movement instead of the hydraulic cylinder 29. A cover plate 34 fastened with screws 33 is additionally located in the lower portion of the saw blade carrier 48 which allows easy replacement of the saw blade 31 after the cover plate is removed. As is evident from FIG. 3, a side support 32 is provided near the portion of the electrolaminate web 13 which is located, in the direction of rotation of the blade, next to the meshing and cutting teeth of the saw blade 31. The side support 32 is hidden by the cover plate 34 in FIG. 3. The remaining portion of the electrolaminate web 13 in the region of the saw blade carrier 48 is engaged by rollers 35 which serve for support, as well as spacers between the saw blade carrier 48 and the electrolaminate web 13.

The drive of the saw blade 31 can be seen in detail in FIG. 4. A hydraulic motor 50 is attached in the lower portion of the saw blade carrier 48. Its power supply lines are not shown for reasons of clarity. A gear wheel 52 mounted on a shaft 51 of the hydraulic motor 50 meshes with a set of teeth 53 on the saw blade shaft 54. This saw blade shaft 54 is supported on ball bearings 55 in the saw blade carrier 48. The saw blade 31 is centrally clamped on the saw blade shaft 54 by means of a disk 56 and a screw 57. An electric motor can also be provided instead of the hydraulic motor 50.

Figure 5:
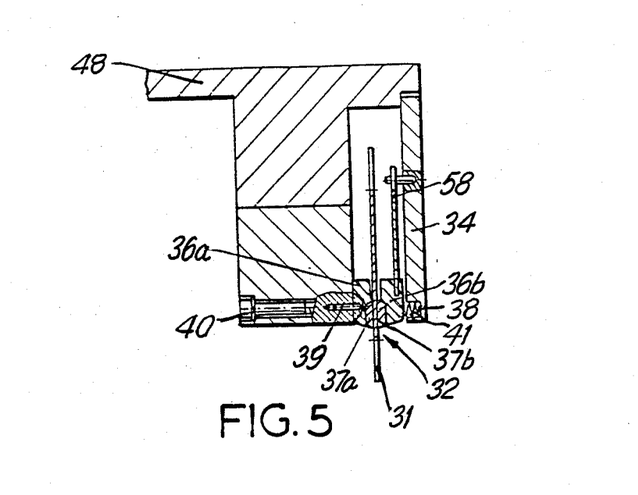
FIG. 5 is a sectional view taken along line E-F of FIG. 3, through the side support for the saw blade.

The side support 32 is shown in more detail in FIG. 5. It includes two support plates 36a, 36b which are fastened on the sides of the saw blade 31. The plates 36a, 36b each have grooves 64 for receiving, respectively, small cutter plates 37a, 37b. The support plate 36b on the right-hand side in the drawing is pressed by means of a spring 38 against the small cutter plate 37b, the opposite end of said spring abutting in a groove 41 in the cover plate 34, so that the small cutter plate 37b rests at the right-hand side surface of the saw blade 31. The support plate 36a on the left-hand side can be displaced by means of a cylindrical pin 39 and an adjustment screw 40 in such a way that the small cutter plate 37a rests at the left-hand surface of the saw blade 31. This arrangement is set up in such a way with the help of the adjustment screw 40 that the saw blade 31 is positioned vertically, turns exactly true, and that, simultaneously, the small cutter plates 37a, 37b rest at the saw blade 31 without tolerance and with slight pressure. The support plate 36b fastened on the right-hand side of FIG. 5 is additionally secured with a retaining strip 58 connected to the cover plate 34.

Figure 6:
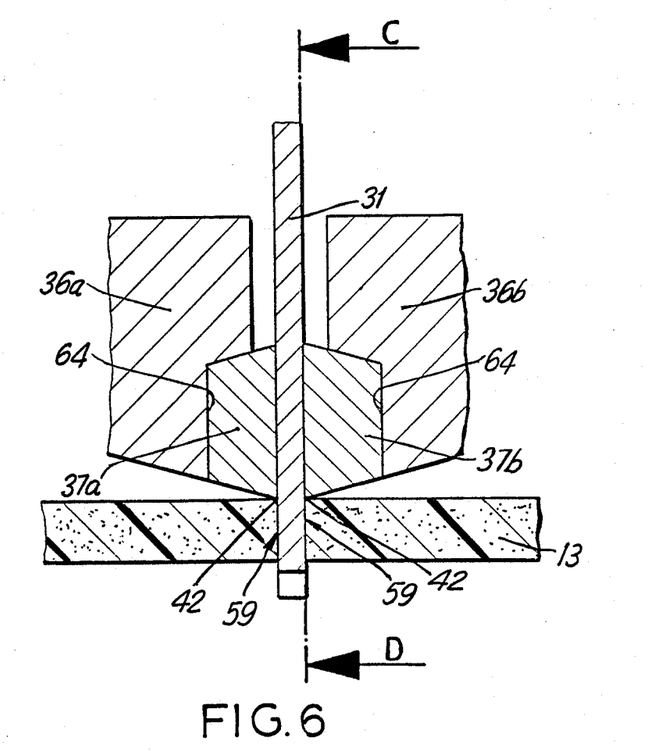
FIG. 6 is an enlarged fragmentary view taken of FIG. 5 which shows the small cutter plates or lamellas.

The small cutter plates 37a, 37b consist of hard alloy and have a trapezoidal cross section, as can be discerned from FIG. 6. Since they are pressed against the saw blade 31, only with slight contact pressure, no wear occurs in practice on the side faces of the saw blade. Only light polishing traces result. If required, the saw blade 31, however, can be given a wear-resistant coating on its surface, for instance, a coating of titanium carbide. The small cutter plates 37a, 37b comprise cutting edges 42 beveled in a conical manner at the corner points or edges of the plates facing away from the center of rotation of the saw blade 31, which corner points or edges are on the longer base side of the trapezoidal plates. The electrolaminate web 13 contacts these cutting edges firmly on the right and left hand sides of the sectioned or severed edge 59 of the webs 13. These cutting edges are designed as elongated edges in the y direction and have a width of several 1/10 mm in the x direction.

Figure 7:
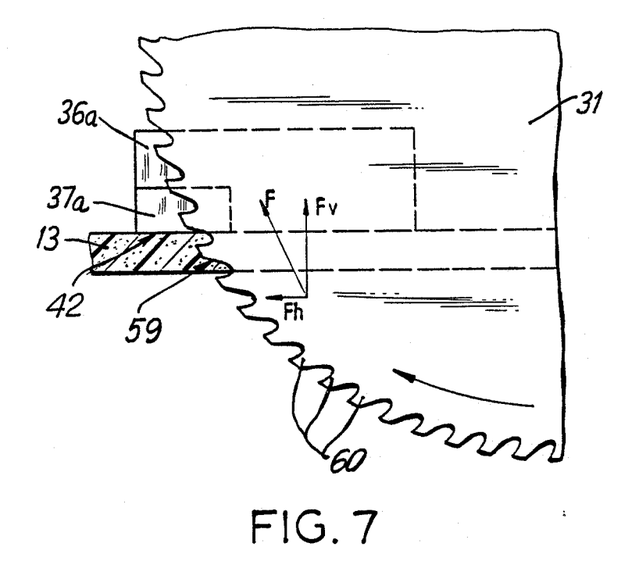
FIG. 7 is a sectional view taken along line C-D of FIG. 6 showing the engendered forces.

The side support 32 is fastened at that point in accordance with the direction of rotation of saw blade 31 at which the teeth 60 of the saw blade 31 plunge into that part of the electrolaminate web 13 which has not yet been cut. As can be seen in FIG. 7, the saw blade 31 thus exerts a force F in the tangential direction at the circumference of the saw blade, upon the electrolaminate web 13. This force F can be resolved into a vertical component Fv and a horizontal component Fh. The vertical force component Fv presses the electrolaminate web 13 against the edge-shaped cutters 42 of the small cutter plates 37a, 37b so that the electrolaminate web 13 is securely supported in the edge area along the sectioned edge 59 during the sawing process. This obtains clean burr-free cut edges at which neither copper chips nor glass fibers protrude from the laminate core.

Viewed in the feed direction of the carriage 23, the cutters 42 slide over the electrolaminate web 13 in the region of the section or severance edges 59, whereby a slight dragging trace arises on the metal coated side at the edge of of the severed edge 59. Since the cutters 42 are designed to be pointed in the y direction, this dragging trace has, however, a width of only a few 1/10 mm so that it does not interfere with the web 13. Because of this dragging of the cutters 42 upon the electrolaminate, the tips of the cutters 42 wear and are ground off only very slowly since the small cutter plates 37a, 37b consist of a hard alloy. If the tip is rounded off to an extent that its support function is beginning to be impaired, easy replacement of the small cutter plates 37a, 37b is possible by removal of the screws 33 and the cover plate 34 shown in FIG. 3.

Figure 8:
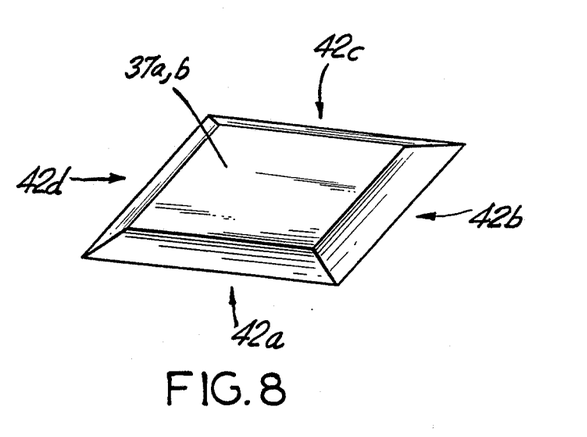
FIG. 8 is a perspective plan view of the small cutter plate.

It is possible to further increase the service life of the small cutter plates 37a, 37b by a special design. For this purpose, the small cutter plates are fabricated with a quadratic base surface, meaning that surface which contacts the saw blade 31, and are given cutting edges 42a–42d at all four edges so that they have the appearance of a flat truncated pyramid, as can be seen in FIG. 8. If the first cutting edge 42a at one edge is worn, then it is only sufficient to rotate the small cutter plates 37a, 37b through 90° so that the new cutting edge 42b at the next edge serves as support. If this cutting edge 42b is worn, then one uses the cutting edge 42c, etc. Thus, the small cutter plates 37a, 37b can be rotated four times before all cutting edges 42a–42d are worn and the small cutter plate 37a, 37b has to be reground.

The metal strip which is produced in the severed edge 59 by the copper foil during the sawing operation as well as the chips from the fiberglass laminate core are aspirated away by vacuum. A suction hose 43 visible in FIG. 2 serves this purpose.

In order to obtain severance edges free from burrs, a firm support of the severed edge is required during the sawing process. As has already been explained, the vertical force component Fv of the saw blade rotation is utilizable for this purpose which presses the severed edge against the cutter of the small cutter plate. Should this force component be insufficient, the section edges can then be additionally pressed against the cutting edge by mechanical means, such as rollers or the like, or by vacuum.

Any plate desired can be sawed from the electrolaminate web 13 by means of the device in the invention with appropriate actuation of the numerically controlled saw. In many instances, however, rectangular panels of the same width as the electrolaminate web 13, but with variable lengths, are desired. For this purpose, the saw head 47 is moved in the x direction with the same velocity as the feed velocity of the electrolaminate web 13. This is achieved by not driving the travelling trolleys 21a, 21b of the guidance axes 20a, 20b (see FIG. 2) in the x direction during the sawing process, rather by coupling the same rigidly with the electrolaminate web 13 so that the travelling trolleys 21a, 21b are moved directly by the electrolaminate web 13. To assure this solid coupling, the travelling trolleys 21a, 21b are connected with each other by means of a crossbeam 61. Several longitudinal beams 62 are located on this cross-beam 61 which carry a suction plate 63. The suction plate 63 lies with application of a vacuum on the panel to be sawed out in the electrolaminate web 13 during the sawing process. The vacuum supply is integrated into the longitudinal beam 62. After the sawing process is terminated, the panel 15 is moved precisely above the pallet in the stacking device 16, the vacuum is switched off and the panel 15 is deposited. Subsequently, the saw head 47 moves back into the original position ready for the next sawing process.

The edge of the electrolaminate web 13 consists, across a certain width, of resin that is partially cured without application of pressure when the web leaves the double band press 1. Therefore, this edge must be trimmed. Circular saws are used for this purpose, whose saw blades are located parallel to the feed direction of electrolaminate web 13. Thus, they are located in the x direction. These trimming saws 44 are attached on the right and left hand sides at the edges of the electrolaminate web 13 in the stand 19, upstream of the saw head 47 in the feed direction of the electrolaminate web 13, as is seen in FIG. 2. These trimming saws 44 are fixed in the x and y directions. Thus, they are fastened in the stand 19 so as not to be displaceable. Apart from that, they are designed similarly to the saw head 47 and thus they can be moved in the vertical direction by means of a cylinder so that they can be brought into the engagement position or out of the engagement position with the electrolaminate web 13. The trimming saws 44 also comprise the already explained side support of the severance edge at the saw blade according to the invention. Thus, the edge trimming of the electrolaminate web 13 is performed with a minimum of waste and all the edges of the sawed-to-size panels 15 are free from burrs. A substitute saw 45 is attached in the stand 19 for each trimming saw 44 so that during saw blade or cutter plate change, the substitute saw 45 can be brought into position and the production of the electrolaminate web 13 does not have to be interrupted. Hydraulic or electromotors are used for driving the saw blades of the trimming saws 44 and substitute saws 45. In the front portion of the stand 19, the electrolaminate web is supported by rollers 46 so that a drooping of the web is avoided. Such rollers naturally can be attached at any required point in the stand 19.

The process of the invention and the associated device has been explained as an example, with an electrolaminate web which can consist of copper coated glass fiber fabric. Naturally, also, other metal coated laminates can be subdivided into panels according to this process and with the described device.

While a specific embodiment of the invention has been shown and described in detail to illustrate the application of the principles of the invention, it will be understood that the invention may be embodied otherwise without departing from such principles.

What is claimed is:

1. A process for subdividing a continuous web into panels having a desired size, the web having a material core made of plural resin impregnated web layers with a metal foil lying on at least one surface of the core, comprising: drawing the web and metal foil layers from rollers; bringing the web and metal foil layers together to form a web; extruding the web under pressure and heat to form a compact laminate web; feeding the laminate web continuously in a feed direction; storing the desired size for the panels in a computer; using the computer to control a saw having a saw blade to cut the laminate web into panels at cut edges in the laminate web; the saw blade having teeth and being rotated to cut through the laminate web from a first surface to a second surface thereof, to form a severed edge in the web; slidably contacting opposite sides of the saw blade with a pair of cutter plates, the cutter plates contacting the saw blade with slight pressure and without play, in the area of the teeth of the saw blade and on the side of the web carrying the second surface of the web, the second surface of the web having the metal foil layer thereon, so as to support the saw blade; the cutter plates each having a narrow edge extending parallel to the severed edge of the web; and slidably contacting the second surface of the web with the narow edges as the teeth of the blade emerge from the second surface of the web to produce a severed edge in the web which is free of burrs.

2. A process according to claim 1, wherein edges of the laminate web extending parallel to the feed direction are cured during the extruding step without the application of pressure, the process including sawing off the edges of the laminated web into panels with additional edge cutting saw blades, each additional saw blade having teeth and being rotated to cut the web from the first surface to the second surface thereof to form additional severed edges in the web; slidably contacting at least one side of each of the additional saw blades with additional cutter plates and under pressure and without play; the additional cutter plates each having additional narrow edges extending parallel to the additional severed edges; the additional cutter plates contacting the additional saw blades and on a side of the web carrying the second surface thereof; and slidably contacting the narrow edges of the additional cutter plates againt the second surface of the web on at least one side of each of the additional severed edges to hold the metal foil while the teeth of the additional saw blades emerge from the second surface of the web.

3. A process according to claim 1, including moving the saw in the feed direction at the same velocity as the movement of the laminate web in the feed direction and cutting the laminate web by simultaneously moving the saw transverse to the feed direction to cut panels from the laminate web which have the same width as the laminate web in a direction transverse to the feed direction.

4. A process according to claim 3, including moving the saw in the feed direction by firmly coupling the saw to the laminate web as the laminate web is moved in the feed direction.

5. A process according to claim 1, wherein the laminate web comprises an electrolaminate web having a material core which is extruded with electrolytically precipitated copper foil forming the metal foil.

6. A device for subdividing a web into panels having a desired size, the web having a material core made of plural resin impregnated web layers with a metal foil layer on at least one surface of the core, comprising: a plurality of web layer take-off units each for feeding one impregnated web layer in a feed direction; at least one metal foil take-off unit ofr feeding a metal foil in the feed direction; a double band press positioned downstream of said take-off units in the feed direction for receiving the impregnated web layers and foil layer and for applying pressure and heat to the layers to form a compacted laminate web for movement downstream of the double band press in the feed direction; transverse cutting means downstream of the double band press in the feed direction for making transverse cuts in the laminate web to subdivide the laminate web into panels; a computer operatively connected to said transverse cutting means to control said transverse cutting means; said transverse cutting means comprising a numberically controlled saw having a trolley mounted for movement parallel to the feed direction, a carriage mounted to said trolley for movement transversely to the feed direction and a saw head mounted to said carriage and having a saw blade for cutting the laminate web with movement of the saw head transversely to the feed direction; said saw blade having teeth and being rotatably mounted to said saw head for cutting through the web from a first surface to a second surface thereof, the metal foil layer being carried on the second surface of the web; means connected between said saw head and said carriage for moving said saw head vertically toward and away from the laminate web with respect to said carriage for moving said saw blade into and out of engagement with the laminate web; and two side supports connected to said saw head on opposite sides of said saw blade and engageable against the laminate web adjacent the saw blade and on opposite sides of a severed edge cut into the laminate web by said saw blade for supporting the material of the laminate web to permit the formation of burr-free cut edges in the panels subdivided from the laminate web; each side support comprising a hard metal alloy cutter plate engaged with slight pressure against a side of said saw blade in the area of said teeth and on the side of the web having the second surface thereof, each cutter plate having a narrow cutting edge extending in the transverse direction of movement of said saw head and engaged against the second surface of the web and at the severed edge of the web during cutting of the web by said saw blade for counteracting a force component in a rotational direction of said saw blade which is applied to the laminate web during cutting of the laminate web, said cutting edge of said cutter plates each sliding along the laminate web with movement of the saw head transversely across the laminate web.

7. A device according to claim 6, wherein said cutting edge for each cutter plate has a width of about a few 1/10 mm.

8. A device according to claim 6, wherein said side supports each comprise a support plate mounted to said saw head and having a groove therein facing a side of said saw blade, each cutter plate being engaged in the groove of one support plate, and mechanical force transmission means connected between said saw head and each support plate for biasing each cutter plate against a respective side of said saw blade by the slight pressure.

9. A device according to claim 8, wherein said saw head includes a cover plate extending over at least a portion of said saw blade and having a recess therein, said mechanical force transmission means comprising a spring engaged in said recess and against a side of one of said support plates facing away from said saw blade for urging said one support plate and its cutter plate against the side of said saw blade.

10. A device according to claim 8, wherein said mechanical force transmission means comprises a pin slidably mounted in said saw head and engageable against a side of one of said support plates for urging said one support plate and its cutter plate against a side of said saw blade, and an adjusting screw seated in said saw head and engageable against said pin for urging said pin toward said saw blade.

11. A device according to claim 6, wherein plate is made of hard alloy material and said blade has sides engageable by said cutter plates which are provided with a wear-resistant coating.

12. A device according to claim 11, wherein said wear-resistant coating comprises titanium carbide.

13. A device according to claim 6, wherein each cutter plate has a trapezoidal cross section taken in a plane which is transverse to the plane containing said saw blade, the trapezoidal cross section having a long base resting against said saw blade, said cutting edge of each cutter plate being formed by the long base of its trapezoidal cross section at a corner of its trapezoidal cross section spaced away from a center of rotation of said saw blade.

14. A device according to claim 13, wherein each cutter plate is in the shape of a shallow truncated pyramid having a quadratic base with four edges each forming a cutting edge.

15. A device according to claim 6, including vacuum means engageable with the laminate web for urging the laminate web against said cutting edge of each cutter plate.

16. A device according to claim 6, including rollers engageable with the laminate web for urging the laminate web against each cutting edge of said cutter plates.

17. A device according to claim 6, including two circular saws each having a saw blade and a side support at a side of the saw blade, said circular saws being fixed between said transverse cutting means and said double band press and effective in the feed direction for cutting edges of the laminate web extending in the feed direction after the laminate web leaves the double band press.

18. A device according to claim 17, including a substitute saw having a saw blade and a side support adjacent each circular saw for cutting an edge of the laminate web extending in the feed direction when an adjacent circular saw is deactivated to permit continuous cutting of the edges of the laminate web.

19. A device according to claim 18, wherein said circular and substitute saws are movable in a direction perpendicular to the feed direction for bringing the circular and substitute saws into and out of engagement with the laminate web leaving said double band press.

* * * * *